(12) United States Patent
Kurosawa

(10) Patent No.: US 11,721,556 B2
(45) Date of Patent: Aug. 8, 2023

(54) ARTICLE MANUFACTURING METHOD, FILM FORMING METHOD, MOLD MANUFACTURING METHOD, EXPOSURE APPARATUS, INFORMATION PROCESSING METHOD, AND NON-TRANSITORY COMPUTER-READABLE MEDIUM STORING A PROGRAM

(71) Applicant: CANON KABUSHIKI KAISHA, Tokyo (JP)

(72) Inventor: Hiroshi Kurosawa, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 201 days.

(21) Appl. No.: 16/935,822

(22) Filed: Jul. 22, 2020

(65) Prior Publication Data
US 2021/0035808 A1 Feb. 4, 2021

(30) Foreign Application Priority Data
Jul. 31, 2019 (JP) .................. 2019-141682

(51) Int. Cl.
*H01L 21/308* (2006.01)
*G03F 7/20* (2006.01)
(Continued)

(52) U.S. Cl.
CPC ........ *H01L 21/3086* (2013.01); *G03F 7/0002* (2013.01); *G03F 7/70625* (2013.01); *H01L 21/0274* (2013.01); *H01L 22/12* (2013.01)

(58) Field of Classification Search
CPC .......... A43B 1/04; A43B 23/024; A43B 23/04; D04B 1/108; D04B 1/26; D04B 1/102; G03F 7/0002; G03F 7/70625; G03F 7/0035; G03F 7/091; G03F 7/094; G03F 7/70641; G03F 9/7026; H01L 21/0274;
(Continued)

(56) References Cited

U.S. PATENT DOCUMENTS 9,941,137 B2 4/2018 Takahata
2008/0111995 A1\* 5/2008 Lee ..................... G03F 9/7026
356/499

(Continued)

FOREIGN PATENT DOCUMENTS

JP 2010243980 A 10/2010
JP 2013102053 A 5/2013
JP 2016219679 A 12/2016

OTHER PUBLICATIONS

Endo "Novel Spin on Planarization Technology by Photo Curing SOC (P-SOC)" Journal of Photopolymer Science and Technology. 2017. vol. 30, No. 3, pp. 373-378. Cited in specification.

*Primary Examiner* — Deoram Persaud
(74) *Attorney, Agent, or Firm* — Rossi, Kimms & McDowell LLP

(57) ABSTRACT

An article manufacturing method includes a first formation step of forming a focus compensation film on a substrate, a second formation step of forming a resist layer on the focus compensation film, and a transfer step of transferring a pattern of an original to the resist layer using an exposure apparatus. In the first formation step, the focus compensation film is formed such that the focus compensation film has a top surface shape corresponding to an image surface shape of the exposure apparatus.

28 Claims, 15 Drawing Sheets

(51) Int. Cl.
*G03F 7/00* (2006.01)
*H01L 21/027* (2006.01)
*H01L 21/66* (2006.01)

(58) Field of Classification Search
CPC . H01L 21/3086; H01L 22/12; H01L 21/0332; A23V 2002/00; A23V 2250/1638; A23L 3/358; A23L 33/16; C02F 1/441; C02F 1/48; C02F 1/68
See application file for complete search history.

(56) References Cited

U.S. PATENT DOCUMENTS

| | | | |
|---|---|---|---|
| 2015/0015861 A1* | 1/2015 | Sentoku | G03F 7/70516 355/77 |
| 2018/0247823 A1* | 8/2018 | LaBrake | H01L 21/31051 |
| 2018/0301331 A1* | 10/2018 | Yoshida | G03F 7/0002 |
| 2019/0255760 A1* | 8/2019 | Hirano | B29C 59/02 |
| 2020/0142299 A1* | 5/2020 | Norikane | G03F 7/70483 |
| 2021/0191257 A1* | 6/2021 | Choi | G03F 7/0002 |
| 2022/0342299 A1* | 10/2022 | Nakamura | B29C 33/424 |

\* cited by examiner

300

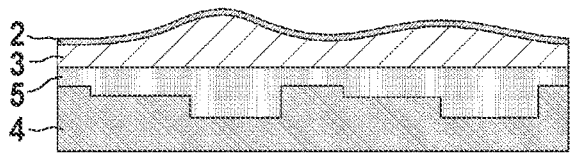
FIG. 3A
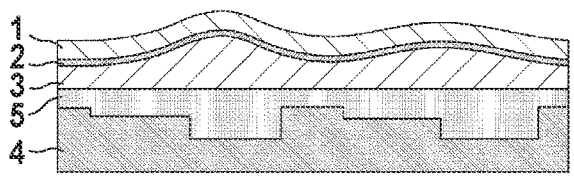
FIG. 3B
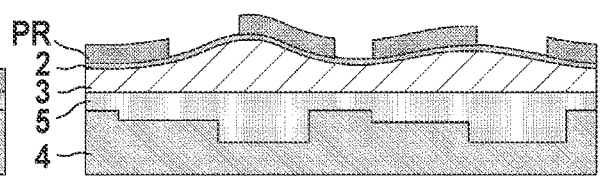
FIG. 3C
FIG. 3D
FIG. 3E
FIG. 3F
FIG. 3G
FIG. 3H

ARTICLE MANUFACTURING METHOD, FILM FORMING METHOD, MOLD MANUFACTURING METHOD, EXPOSURE APPARATUS, INFORMATION PROCESSING METHOD, AND NON-TRANSITORY COMPUTER-READABLE MEDIUM STORING A PROGRAM

BACKGROUND OF THE INVENTION

Field of the Invention

The present invention relates to an article manufacturing method, a film forming method, a mold manufacturing method, an exposure apparatus, an information processing method, and a non-transitory computer-readable medium storing a program.

Description of the Related Art

Japanese Patent Laid-Open No. 2016-219679 describes a substrate planarizing method in which a resist is dropped onto a substrate having a topography, the imprint surface of a blank template is pressed against the resist, the resist is cured, and then the blank template is released from the resist. The planarization of the substrate is useful to ensure that the photoresist layer fits in the depth of focus (DOF) of the projection optical system in a subsequent photolithography step.

In an exposure apparatus used in a photolithography step, the NA of the projection optical system has been increased to reduce the minimum resolution dimension, and the DOF has been reduced accordingly. For example, in an EUV exposure apparatus including a projection optical system with an NA of 0.33, the DOF is 110 nm to 300 nm depending on the illumination condition. In the next generation where the NA is 0.55, the DOF can be about 40 nm to 160 nm depending on the illumination condition.

Since defocus occurs due to various factors, it is impossible to use the entire DOF by the unevenness (height difference) on the surface of the substrate. Therefore, even in the generation where the NA is 0.55, in order to satisfy the DOF under all illumination conditions, the unevenness on the surface of the substrate should be suppressed to, for example, 4 nm or less.

TABLE 1

| Reticle image defocus factor | Details |
| --- | --- |
| Caused by exposure apparatus (including flatness of reticle) | 1. Flatness of reticle<br>2. Deformation of base plate<br>3. Aberration of projection optical system<br>4. Flatness of wafer chuck<br>5. Stage servo, locus calculation error<br>6. Calculation error correction residual due to pattern unevenness<br>7. Stability of focus sensor |
| Caused by process wafer | 8. Pattern unevenness<br>9. Nonuniformity of top surface shape of shot region in wafer surface |

Table 1 shows the factors that cause defocus in the photolithography step. It is necessary to ensure that the total defocus generated due to the factors 1 to 9 fits in the DOF of the exposure apparatus. The factors 1 to 7 are factors on the exposure apparatus side including the reticle. The factors 8 and 9 are wafer factors. The SOC (Spin On Carbon) layer that is generally used in the semiconductor process after the 45-nm node is a technique for improving the factors 8 and 9.

A known example of planarizing a process wafer using an SOC layer is a three-layer structure in which an SOC layer, a planarizing SOG intermediate (HM) layer, and a photoresist layer for a photolithography step are stacked on an underlaying layer having an unevenness. The planarized photoresist layer is patterned in a photolithography step using an exposure apparatus. As an example of improving the flatness of the SOC layer, there is a method in which a heat-curing or UV-curing resist is spin-coated on the surface of a patterned wafer, baked in an environment of about 200° C., and cured by reheating or irradiation with UV light after the reflow of the resist reaches an equilibrium state ("Novel Spin on Planarization Technology by Photo Curing SOC (P-SOC)", Journal of Photopolymer Science and Technology Volume 30, Number 3 (2017)).

As the DOF becomes narrow, it has been required to improve the individual factors listed in Table 1. However, the factors caused by the exposure apparatus have already been reduced as much as possible, and there is a limit on the conventional approach for pursuing the planarization of the surface of the process wafer.

SUMMARY OF THE INVENTION

The present invention provides a technique advantageous in ensuring that the exposure region of a substrate fits in the DOF of an exposure apparatus.

A first aspect of the present invention provides an article manufacturing method comprising: a first formation step of forming a focus compensation film on a substrate; a second formation step of forming a resist layer on the focus compensation film; and a transfer step of transferring a pattern of an original to the resist layer using an exposure apparatus, wherein in the first formation step, the focus compensation film is formed such that the focus compensation film has a top surface shape corresponding to an image surface shape of the exposure apparatus.

Further features of the present invention will become apparent from the following description of exemplary embodiments with reference to the attached drawings.

BRIEF DESCRIPTION OF THE DRAWINGS

FIGS. 3A to 3H are views for explaining an article manufacturing method and a film forming method according to the first embodiment;

DESCRIPTION OF THE EMBODIMENTS

Figure 1A:
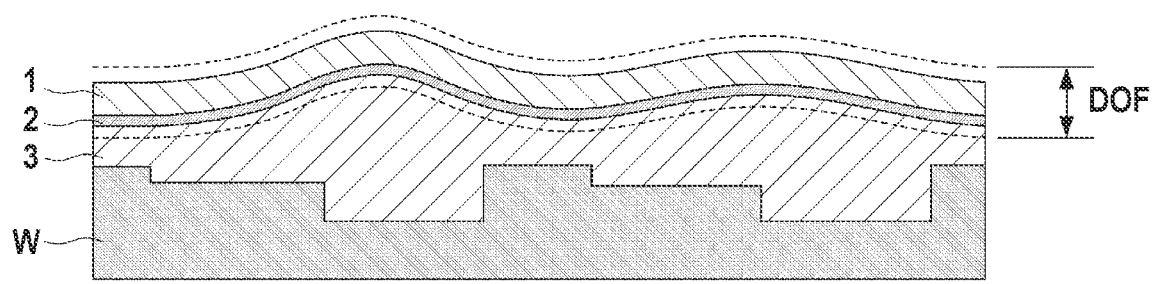
FIG. 1A is a view schematically showing a structure manufactured in an article manufacturing method and a film forming method according to one embodiment of the present invention.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

Figure 1B:
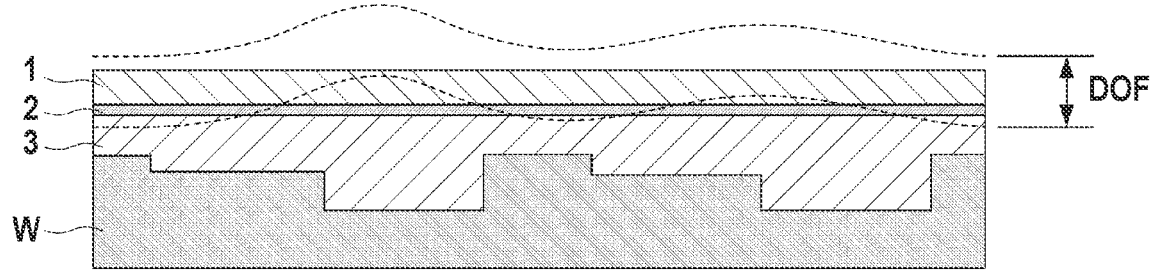
FIG. 1B is a view schematically showing a structure manufactured in an article manufacturing method and a film forming method according to a conventional traditional approach.

FIG. 1A schematically illustrates a structure manufactured in an article manufacturing method and a film forming method according to one embodiment of the present invention. FIG. 1B schematically illustrates a structure manufactured in an article manufacturing method and a film forming method according to a conventional traditional approach. First, a process wafer (process substrate) W including an uneven surface is prepared. The unevenness of the surface can depend on the pattern of the process wafer W. The process wafer W can include, for example, a layer that is patterned later by etching. A focus compensation film 3 can be formed on the process wafer W. The focus compensation film 3 can have a thickness in a range of 60 nm to 200 nm, for example, but may have another thickness.

An SOG (Spin On Glass) film 2 can be arranged as an arbitrary element on the focus compensation film 3. The SOG film 2 can be used as a hard mask for etching a layer below the focus compensation film 3. A photoresist layer (resist layer) 1 can be formed on the focus compensation film 3 or the SOG film 2. The pattern of a reticle (original) can be transferred to the photoresist layer 1 as a latent image pattern in an exposure step performed using an exposure apparatus, and then the latent image pattern is converted into a resist pattern through a development step. In each of FIGS. 1A and 1B, two dotted lines indicate the DOF of the exposure apparatus in the exposure step of the photoresist layer 1. It is preferable that the best focus surface of the exposure apparatus is located within the DOF range indicated by the two lines.

In one aspect of the device application, as the memory devices are stacked, the unevenness (for example, 80 nm to 100 nm) caused by the device pattern of the process wafer W tends to increase. On the other hand, the DOF in the exposure apparatus is narrowed as the NA of the projection optical system is increased. In an EUV exposure apparatus including a projection optical system with an NA of 0.33, the DOF is 110 nm to 300 nm depending on the illumination condition. In the next generation where the NA is 0.55, the DOF can be about 40 nm to 160 nm depending on the illumination condition.

FIG. 1B shows a conventional example for forming the focus compensation film 3. According to the conventional example, the focus compensation film 3 is formed such that the surface of the photoresist layer 1 on the process wafer W becomes nearly "planar" without considering the image surface shape of the projection optical system in a subsequent pattern exposure step. On the other hand, it is difficult to completely planarize the best focus surface of the exposure apparatus in the exposure step, and this has been one of the factors of consuming the DOF of the projection optical system of the exposure apparatus. In the conventional traditional approach, the defocus amount to be distributed (allowed) to the process wafer W and the defocus amount to be distributed (allowed) to the exposure apparatus are individually set, but there is a limit on such an approach.

As schematically shown in FIG. 1A, in this embodiment, the focus compensation film 3 having a top surface shape corresponding to the image surface shape of the exposure apparatus is formed so that the photoresist layer 1 of the process wafer W fits in the DOF of the exposure apparatus. In this embodiment, ultimately, the focus compensation film 3 having the top surface shape which is the same as the image surface shape (that is, the target top surface shape) of the exposure apparatus can be formed, but the top surface shape of the focus compensation film 3 may be different from the image surface shape of the exposure apparatus within an allowable range. According to the approach of this embodiment, it is not required to form the image surface of the exposure apparatus to be planer at high level, and it is also not required to form, on the process wafer W, a focus compensation film having flatness at high level. According to this embodiment, the image surface curvature components caused by the exposure tool and the reticle to which the budget is conventionally distributed in a fixed manner are solved, and the budget obtained by the improvement can be redistributed to the defocus factors caused by the process wafer and another exposure tool.

Here, the image surface shape of the exposure apparatus is, for example, a shape that can be evaluated as the image surface curvature. In an exposure apparatus configured as a stepper, the image surface shape of the exposure apparatus can be evaluated as a two-dimensional distribution of the difference between the image surface (best focus surface) and the reference surface (designed image surface) of the projection optical system of the exposure apparatus. In an exposure apparatus configured as a scanner (scanning exposure apparatus), the image surface shape of the exposure apparatus means the effective image surface shape. That is, the image surface shape of the exposure apparatus configured as a scanner can be evaluated as a two-dimensional distribution of the difference between the exposed surface of the substrate and the image surface (best focus surface) of the projection optical system, which appears in the result of scanning exposure by the exposure apparatus. The exposed surface of the substrate is, for example, a surface composed of a set of centers of the photoresist layer 1 in the thickness direction. In the exposure apparatus configured as a scanner, the position control accuracy of the substrate during scanning exposure influences the effective image surface shape of the exposure apparatus. For example, if the position control accuracy of the substrate during scanning exposure is poor, the effective image surface shape largely differs from the ideal shape. That is, if the position control accuracy of the substrate during scanning exposure is poor, it can effectively cause the defocus similar to that generated when the image surface curvature aberration of the projection optical system is large.

Figure 2:
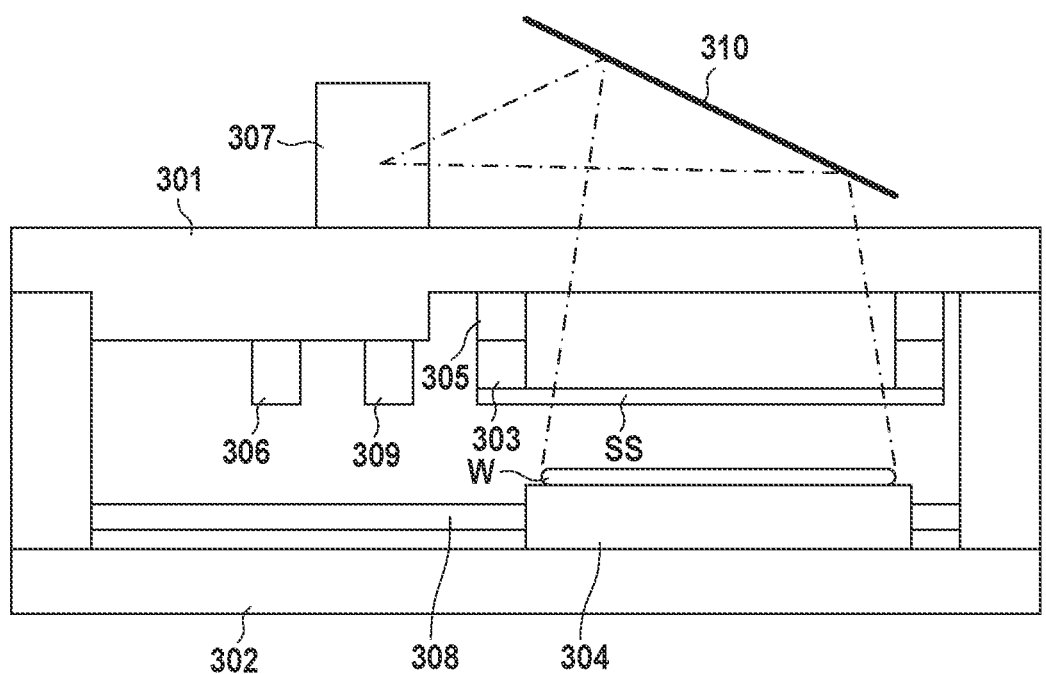
FIG. 2 is a view showing an arrangement example of a film forming apparatus that can be used in a step of forming a focus compensation film.
Figure 2:
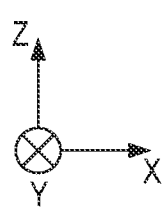

FIG. 2 shows an arrangement example of a film forming apparatus 300 that can be used in a step of forming the focus compensation film 3. The film forming apparatus 300 can include, as a mechanism for driving the process wafer (substrate) W, a substrate holder 304 that holds the process wafer W, and a substrate driving mechanism 308 that drives the process wafer W by driving the substrate holder 304 on a base plate 302. The film forming apparatus 300 can include, as a mechanism for driving a superstrate (mold) SS, a mold holder 303 that holds the superstrate SS, and a mold driving mechanism 305 that drives the superstrate SS by driving the mold holder 303.

Figure 8:
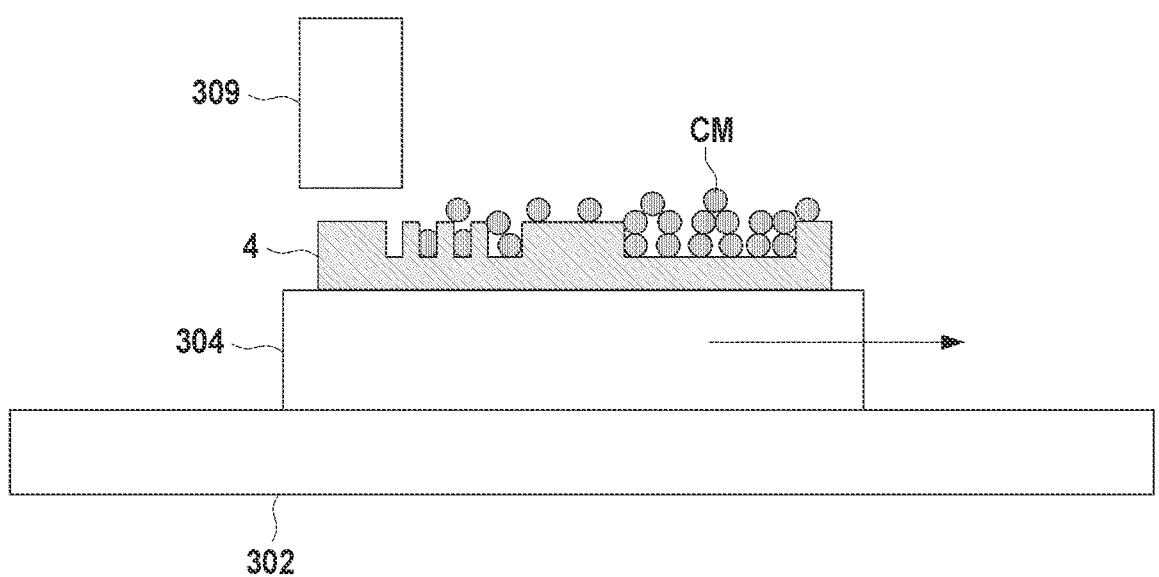
FIG. 8 is a view for explaining a step of arranging a composition on a process wafer by a dispenser.

The film forming apparatus 300 can include a dispenser 309 that supplies (arranges) a composition on the process wafer W. For example, as schematically shown in FIG. 8, a composition CM can be arranged on a process wafer 4 by discharging the composition CM from the dispenser 309 while scanning the process wafer 4 in the X-Y direction by the substrate driving mechanism 308. The dispenser 309 can discharge the composition CM based on a drop recipe (composition arrangement information) prepared in advance in synchronization with the driving of the process wafer 4 by the substrate driving mechanism 308. Here, the drop recipe can be prepared such that the composition CM is arranged at high density in a portion of the process wafer W where the density of concave portions is high, and the composition CM is arranged at low density in a portion of the process wafer W where the density of concave portions is low. In addition, the drop recipe can be prepared such that the composition CM is arranged on the process wafer W at a density corresponding to the image surface shape of the exposure apparatus so that the focus compensation film 3 having a top surface shape corresponding to the image surface shape (target top surface shape) of the exposure apparatus used in the subsequent exposure step is formed.

The composition is a curable composition (to be also referred to as a resin in an uncured state) to be cured by receiving curing energy. As the curing energy, an electromagnetic wave, heat, or the like can be used. The electromagnetic wave can be, for example, light, such as infrared light, a visible light beam, or ultraviolet light, selected from the wavelength range of 10 nm (inclusive) to 1 mm (inclusive). The curable composition is a composition cured by light irradiation or heating. Among compositions, a photocurable composition cured by light contains at least a polymerizable compound and a photopolymerization initiator, and may further contain a nonpolymerizable compound or a solvent, as needed. The nonpolymerizable compound is at least one material selected from the group consisting of a sensitizer, a hydrogen donor, an internal mold release agent, a surfactant, an antioxidant, and a polymer component. The curable composition is discharged from the dispenser 309, and may be applied onto the process wafer (substrate) in the form of droplets or in the form of an island or film formed by connecting a plurality of droplets. Alternatively, if allowed, the curable composition may be applied onto the process wafer (substrate) in the form of a film by a spin coater or a slit coater. The viscosity (the viscosity at 25° C.) of the curable composition is, for example, equal to or higher than 1 mPa·s. In the following embodiments, the composition is preferably an ultraviolet curable resist, for example, but the present invention is not limited to this.

The film forming apparatus 300 can include an alignment scope 306. The alignment scope 306 can be supported by a bridge 301 coupled to the base plate 302. After the process wafer W is transferred to the substrate holder 304 and held by the substrate holder 304, the position of the process wafer W can be measured using the alignment scope 306. The position information of the process wafer W obtained using the alignment scope 306 can be, for example, used in an operation of arranging the composition on the process wafer W by the dispenser 309, alignment between the process wafer W and the superstrate SS, and the like.

The superstrate SS is, for example, a thin plate made of quartz or glass, and is held by the mold holder 303. The composition is arranged on the process wafer W by the dispenser 309, and the process wafer W is positioned below the superstrate SS by the substrate driving mechanism 308. Thereafter, the mold driving mechanism 305 drives the superstrate SS downward, so that the superstrate SS can come into contact with the composition on the process wafer W. The superstrate SS in contact with the composition on the process wafer W attracts the process wafer W by a capillary force, and the composition can spread in the space between the process wafer W and the superstrate SS. After the composition spreads in the space between the process wafer W and the superstrate SS, a curing unit 307 can irradiate the composition with curing energy via a mirror 310 and the superstrate SS. Thus, the composition is cured and a focus compensation film made of the cured composition can be formed. The curing unit 307 can irradiate the composition with, for example, ultraviolet light having a wavelength peak around 310 nm or around 365 nm as the curing energy. The curing energy may be applied to the entire region of the process wafer W, or may be partially applied to the process wafer W.

After the composition between the process wafer W and the superstrate SS is cured, the mold driving mechanism 305 lifts the superstrate SS to separate the superstrate SS from the focus compensation film as a cured product of the composition. Then, the process wafer W can be unloaded from the film forming apparatus 300. The process wafer W may be unloaded from the film forming apparatus 300 after having undergone post baking in the film forming apparatus 300. Alternatively, the process wafer W may be unloaded from the film forming apparatus 300 after another focus compensation film is formed on the above-described focus compensation film.

An article manufacturing method and a film forming method according to the first embodiment will be described below with reference to FIGS. 3A to 3H. First, in a step shown in FIG. 3A, a process wafer 4 can be prepared. The process wafer 4 can include at least one patterned layer and a layer covering the patterned layer. Alternatively, the process wafer 4 may be a bare wafer. When the process wafer 4 is a bare wafer, steps shown in FIGS. 3B and 3C can be omitted.

In a step shown in FIG. 3B, the process wafer 4 can be loaded into a film forming apparatus 300 and a composition 5' can be arranged on the process wafer 4 using a dispenser 309. At this time, a composition 5' can be arranged at high density in a portion of the process wafer 4 where the density of concave portions is high, and the composition 5' can be arranged at low density in a portion of the process wafer 4 where the density of concave portions is low. Next, in a step shown in FIG. 3C, a mold driving mechanism 305 drives a superstrate M1 so as to bring the superstrate M1 into contact with the composition 5' on the process wafer 4. Then, a curing unit 307 can irradiate the composition 5' with curing energy via a mirror 310 and the superstrate M1. With this step, the composition 5' is cured, and a planarizing film 5 made of the cured composition 5' can be formed. After that, the superstrate M1 can be separated from the planarizing film 5. At this stage, post baking may be performed to promote the crosslinking of the planarizing film 5. Instead of the steps shown in FIGS. 3B and 3C, a step of forming an SOC (Spin On Carbon) film as the planarizing film 5 may be performed.

Next, in a step (arrangement step) shown in FIG. 3D, a composition 3' can be arranged on the planarizing film 5 using the dispenser 309 in a density distribution corresponding to the image surface shape of the exposure apparatus used in a subsequent exposure step shown in FIG. 3H. Then, in a step (film formation step) shown in FIG. 3E, a focus compensation film 3 can be formed. More specifically, first, the mold driving mechanism 305 can drive a superstrate M2 so as to bring the superstrate M2 into contact with the composition 3' on the process wafer 4 (a contact step). Then, in a state in which the superstrate M2 is deformed into a shape according to the density distribution of the composition 3', the curing unit 307 can irradiate the composition 3' with curing energy via the mirror 310 and the superstrate M2 (a curing step). With this step, the composition 3' is cured, and the focus compensation film 3 made of the cured composition 3' can be formed. After that, the superstrate M2 can be separated from the focus compensation film 3 (a separation step). With the film formation step described above, the focus compensation film 3 having a top surface shape corresponding to the image surface shape of the exposure apparatus used in the subsequent exposure step can be formed. Thereafter, the process wafer 4 can be unloaded from the film forming apparatus 300.

In one example, before the step shown in FIG. 3E, the superstrate M1 held by the mold holder 303 can be changed to the superstrate M2. In another example, the superstrate M1 may be used as the superstrate M2. In this case, the change from the superstrate M1 to the superstrate M2 is unnecessary.

Next, a step shown in FIG. 3F can be performed, but this step is an arbitrary step. In this step, an SOG film 2 can be formed on the focus compensation film 3. Then, in a step shown in FIG. 3G, a photoresist layer 1 can be formed on the focus compensation film 3 or the SOG film 2 using a spin coater or the like. Subsequently, a step (photolithography step) shown in FIG. 3H can be performed. In this step, first, the photoresist layer 1 can be exposed using the exposure apparatus to form the latent image of a reticle pattern on the photoresist layer 1. Then, the photoresist layer 1 can be developed to form a resist pattern PR.

An article manufacturing method and a film forming method according to the second embodiment will be described below with reference to FIGS. 4A to 4H. The second embodiment uses, in a step shown in FIG. 4E, a superstrate M2 that has a top surface shape (the shape of the surface which contacts a composition) corresponding to the image surface shape of an exposure apparatus used in an exposure step shown in FIG. 4H. Here, the top surface shape corresponding to the image surface shape of the exposure apparatus is a shape whose difference from the image surface shape of the exposure apparatus falls within an allowable range, and can be ultimately the same shape as the image surface shape of the exposure apparatus.

Figure 4A:
FIGS. 4A to 4H are views for explaining an article manufacturing method and a film forming method according to the second embodiment.
Figure 4F:
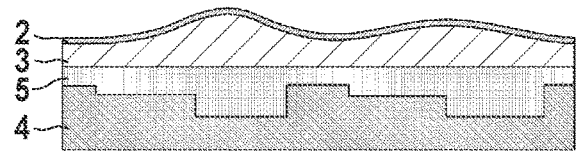
Figure 4B:
Figure 4G:
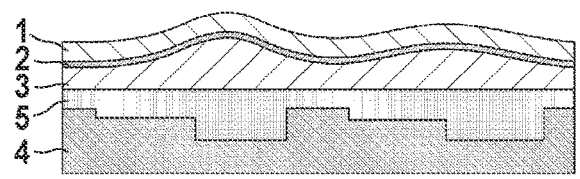
Figure 4C:
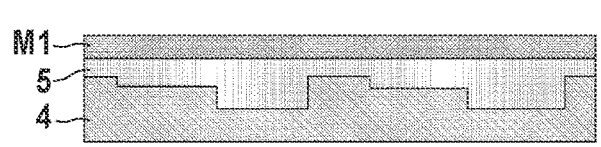
Figure 4H:
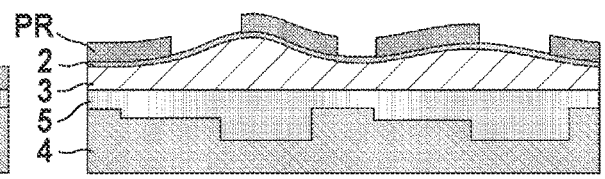
Figure 4D:
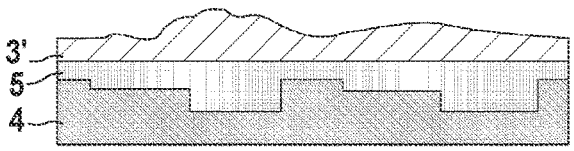
Figure 4E:
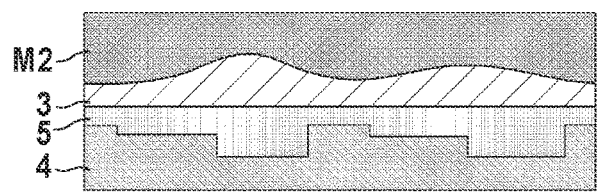

In a step (film formation step) shown in FIG. 4E, a focus compensation film 3 can be formed. More specifically, first, a mold driving mechanism 305 can drive the superstrate M2 so as to bring the superstrate M2 into contact with a composition 3' on a process wafer 4 (a contact step). Then, in a state in which the space between a planarizing film 5 and the superstrate M2 is filled with the composition 3', a curing unit 307 can irradiate the composition 3' with curing energy via a mirror 310 and the superstrate M2 (a curing step). With this step, the composition 3' is cured, and the focus compensation film 3 made of the cured composition 3' can be formed. Then, the superstrate M2 can be separated from the focus compensation film 3 (a separation step). With the steps described above, the focus compensation film 3 having a top surface shape corresponding to the image surface shape of the exposure apparatus used in the subsequent exposure step can be formed. Thereafter, the process wafer 4 can be unloaded from the film forming apparatus 300.

Other points in the second embodiment are similar to those in the first embodiment. In the second embodiment, it is necessary to create the superstrate M2 having the top surface shape (the shape of the surface which contacts the composition) corresponding to the image surface shape of the exposure apparatus. However, in the second embodiment, it is possible to define the top surface shape of the focus compensation film 3 without being restricted by the arrangement error of the composition 3', the reflow of the composition 3', the rigidity and the characteristics of transient deformation of the superstrate M2, or the like.

An article manufacturing method and a film forming method according to the third embodiment will be described below with reference to FIGS. 5A to 5I. The third embodiment is similar to the second embodiment in that a superstrate M2 having a top surface shape (the shape of the surface which contacts a composition) corresponding to the image surface shape of an exposure apparatus used in an exposure step shown in FIG. 5H is used in a step shown in FIG. 5E. However, the top surface shape of the superstrate M2 used in the third embodiment includes a plurality of concave portions each having a depth corresponding to the top surface shape corresponding to the image surface shape of the exposure apparatus. Here, the top surface shape of the superstrate M2 can be a shape in which the difference between the envelope surface of the bottoms of the plurality of concave portions and the image surface shape of the exposure apparatus falls within an allowable range. Ultimately, the envelope surface can have the same shape as the image surface shape of the exposure apparatus.

Steps shown in FIGS. 5A to 5D are similar to the steps shown in FIGS. 4A to 4D, respectively. In a step (film formation step) shown in FIG. 5E, a focus compensation film 3 can be formed. More specifically, first, a mold driving mechanism 305 can drive the superstrate M2 so as to bring the superstrate M2 into contact with a composition 3' on a process wafer 4. Then, in a state in which the space between a planarizing film 5 and the superstrate M2 and the concave portions of the superstrate M2 are filled with the composition 3', a curing unit 307 can irradiate the composition 3' with curing energy via a mirror 310 and the superstrate M2. With this step, the composition 3' is cured, and a frame structure 3" made of the cured composition 3' can be formed. Then, the superstrate M2 can be separated from the frame structure 3". With the steps described above, as can be shown in FIG. 5F, the frame structure 3" having the envelop surface corresponding to the image surface shape of the exposure apparatus used in the subsequent exposure step can be formed. Thereafter, the process wafer 4 can be unloaded from the film forming apparatus 300.

Figure 5A:
FIGS. 5A to 5I are views for explaining an article manufacturing method and a film forming method according to the third embodiment.
Figure 5F:
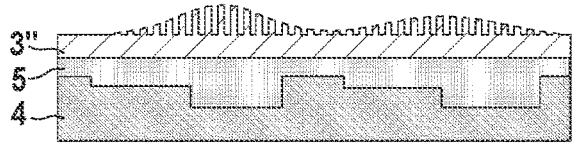
Figure 5B:
Figure 5G:
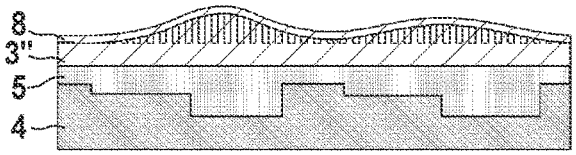
Figure 5C:
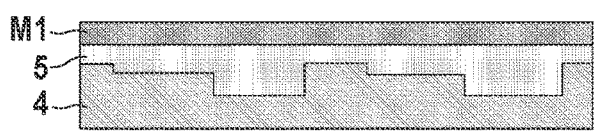
Figure 5H:
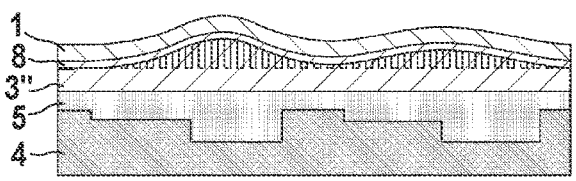
Figure 5D:
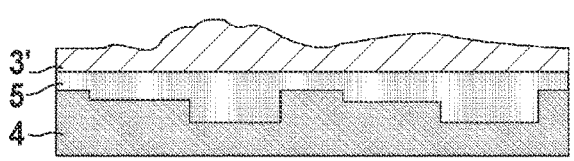
Figure 5I:
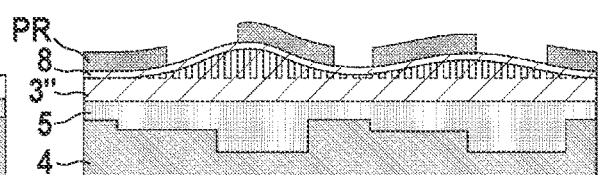
Figure 5E:
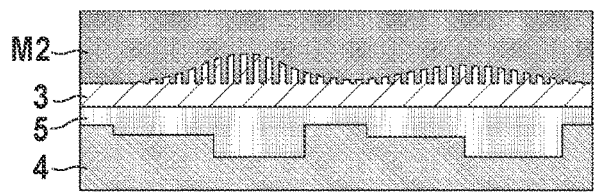

Next, in a step shown in FIG. 5G, a smoothing layer 8 can be formed on the frame structure 3" using a spin coater or the like. The smoothing layer 8 can include a portion filled in the concave portions of the frame structure 3". Alternatively, the smoothing layer 8 can be formed such that the concave portions of the frame structure 3" are filled with the constituent material of the smoothing layer 8. The frame structure 3" and the smoothing layer 8 form a focus compensation film. Then, in the step shown in FIG. 5H, a photoresist layer 1 can be formed on the smoothing layer 8 using a spin coater or the like. Subsequently, a step (photolithography step) shown in FIG. 5I can be performed. In this step, first, the photoresist layer 1 can be exposed using the exposure apparatus to form the latent image of a reticle pattern on the photoresist layer 1. Then, the photoresist layer 1 can be developed to form a resist pattern PR.

In the third embodiment, it is necessary to create the superstrate M2 including the concave portions corresponding to the image surface shape of the exposure apparatus. However, in the third embodiment, it is possible to define the top surface shape of the focus compensation film formed by the frame structure 3" and the smoothing layer 8 without being restricted by the arrangement error of the composition 3', the reflow of the composition 3', the rigidity and the characteristics of transient deformation of the superstrate M2, or the like.

In each of the second and third embodiments, the topography of the surface of the focus compensation film is determined by the superstrate M2, so that if the composition 3' has a high reflow property, the composition 3' may be arranged with low accuracy. Therefore, the composition 3' may be arranged on the process wafer 4 by a spin coater or the like.

An article manufacturing method and a film forming method according to the fourth embodiment will be described below with reference to FIGS. 6A to 6F. Matters not mentioned as the fourth embodiment can follow any of the first to third embodiments. In the fourth embodiment, a film corresponding to the structure including the planarizing film 5 and the focus compensation film 3 in the first and second embodiments is formed as a focus compensation film 3 in one film formation step.

Figure 6A:
FIGS. 6A to 6F are views for explaining an article manufacturing method and a film forming method according to the fourth embodiment.
Figure 6B:
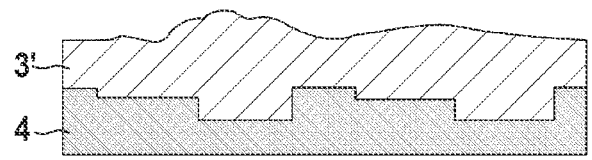

First, in a step shown in FIG. 6A, a process wafer 4 can be prepared. In the step shown in FIG. 6B, the process wafer 4 can be loaded into a film forming apparatus 300 and a composition 3' can be arranged on the process wafer 4 using a dispenser 309. At this time, the composition 3' can be arranged in a distribution adjusted in accordance with the top surface shape of the process wafer 4 and the image surface shape of an exposure apparatus used in a subsequent exposure step shown in FIG. 6F so that the focus compensation film 3 having an upper surface corresponding to the image surface shape can be obtained in a step shown in FIG. 6C.

Figure 6C:
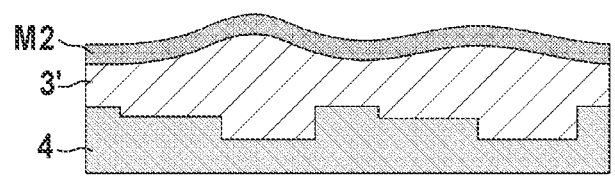

Then, in the step (film formation step) shown in FIG. 6C, the focus compensation film 3 can be formed. More specifically, first, a mold driving mechanism 305 can drive a superstrate M2 so as to bring the superstrate M2 into contact with the composition 3' on the process wafer 4 (a contact step). Then, in a state in which the superstrate M2 is deformed into a shape according to the density distribution of the composition 3', a curing unit 307 can irradiate the composition 3' with curing energy via a mirror 310 and the superstrate M2 (a curing step). With this step, the composition 3' is cured, and the focus compensation film 3 made of the cured composition 3' can be formed. Then, the superstrate M2 can be separated from the focus compensation film 3 (a separation step). With the film formation step described above, the focus compensation film 3 having a top surface shape corresponding to the image surface shape of the exposure apparatus used in the subsequent exposure step can be formed. Thereafter, the process wafer 4 can be unloaded from the film forming apparatus 300.

Figure 6D:
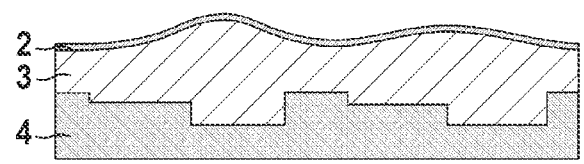
Figure 6E:
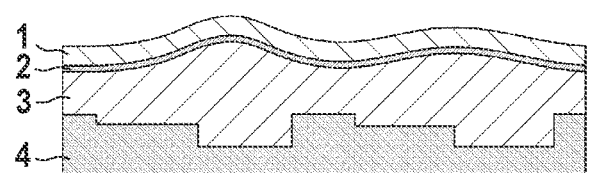
Figure 6F:
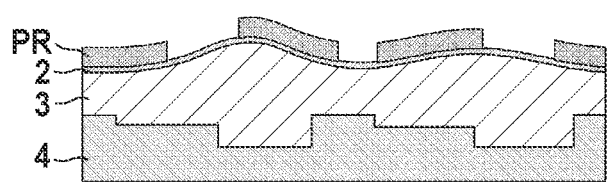

Next, a step shown in FIG. 6D can be performed, but this step is an arbitrary step. In this step, an SOG film 2 can be formed on the focus compensation film 3. Then, in a step shown in FIG. 6E, a photoresist layer 1 can be formed on the focus compensation film 3 or the SOG film 2 using a spin coater or the like. Subsequently, a step (photolithography step) shown in FIG. 6F can be performed. In this step, first, the photoresist layer 1 can be exposed using the exposure apparatus to form the latent image of a reticle pattern on the photoresist layer 1. Then, the photoresist layer 1 can be developed to form a resist pattern PR.

Figure 7A:
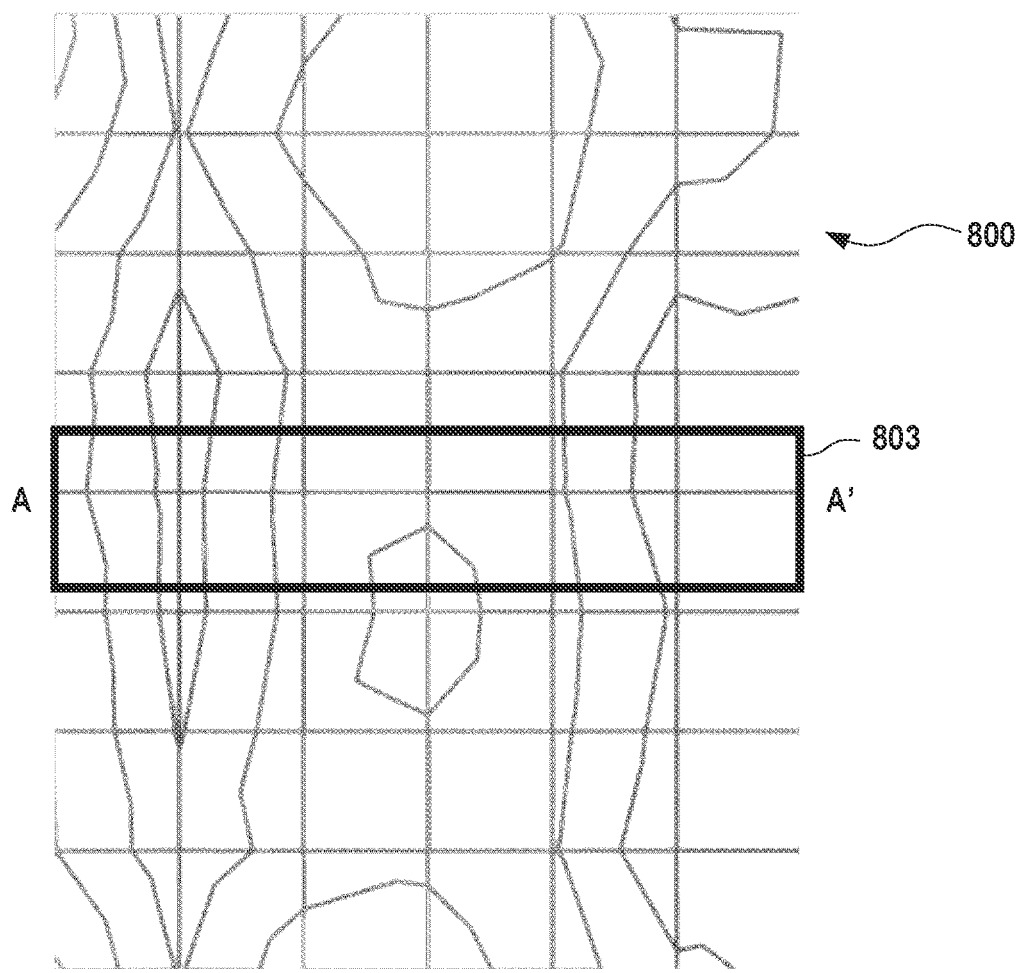
FIGS. 7A and 7B are views for explaining the defocus improving effect by the focus compensation film.

The defocus improving effect by the focus compensation film 3 will be described below with reference to FIGS. 7A and 7B. FIG. 7A is a contour diagram showing the image surface shape of the exposure apparatus used in the exposure step. In this example, the exposure apparatus is a scanning exposure apparatus (scanner), and an exposure slit 803 indicates a region irradiated with exposure light at a certain moment. In the scanning exposure apparatus, the image surface shape is a two-dimensional distribution of the difference between the exposed surface (the surface formed by the set of the centers of the photoresist layer 1 in the thickness direction) of the substrate and the best focus surface, which appears in the result of the scanning exposure.

Figure 7B:
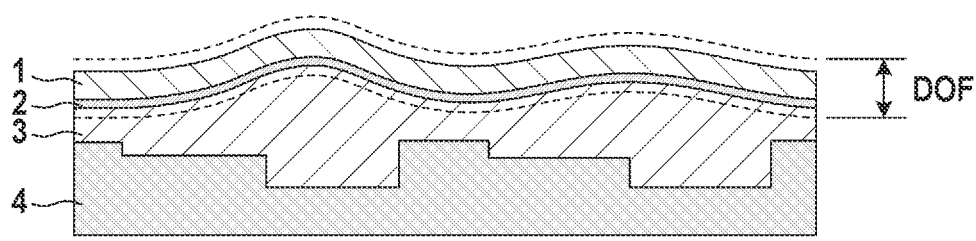

FIG. 7B schematically shows the sectional structure of the substrate (here, the structure including the process wafer 4, the focus compensation film 3, the SOG film 2, and the photoresist layer 1) taken along a line A-A' in FIG. 7A. If the shape of the surface formed by the set of the centers of the photoresist layer 1 in the thickness direction can be matched with the image surface shape of the exposure apparatus, the photoresist layer 1 fits in the DOF of the exposure apparatus.

In the scanning exposure apparatus, during scanning exposure, follow-up control is performed regarding the Z-axis, the ωx-axis (a rotation around the X-axis), and the ωy-axis (a rotation around the Y-axis) of the process wafer W based on a sensor measurement result. Therefore, no error other than the measurement error by the sensor and the servo deviation is generated with respect to the unevenness component of the spatial frequency equal to or larger than the area of the exposure slit 803. However, the curved surface component in which the center of thickness of the photoresist layer 1 deviates from the image surface of the projection optical system in the exposure slit 803 has not been corrected conventionally even though it is a defocus factor with reproducibility.

The best focus surface of the exposure apparatus can be detected, for example, by performing measurement using a reticle for inspection or by measuring an aerial image of the reticle pattern using a sensor mounted on the wafer stage. The image surface shape of the scanning exposure apparatus can be obtained by subtracting the 0th-order component (offset) and the first order components (inclination), which can be corrected by servo follow-up, from the best focus surface that can be detected as described above.

Figure 9:
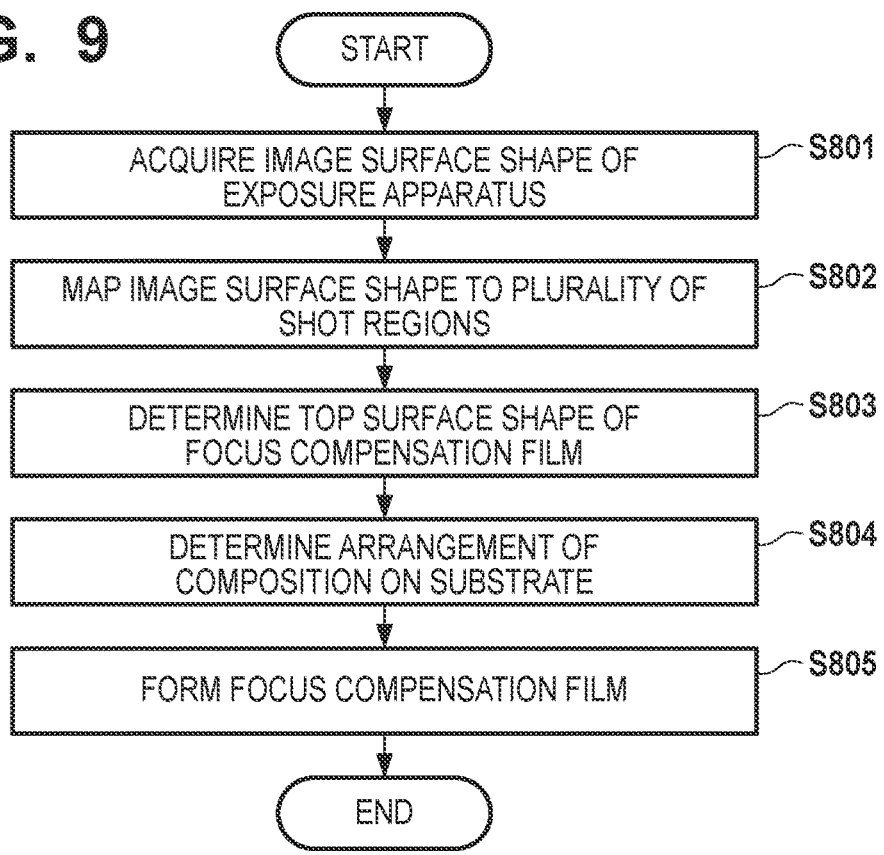
FIG. 9 is a flowchart for explaining an article manufacturing method and a film forming method according to the fifth embodiment.

FIG. 9 is a flowchart for explaining an article manufacturing method and a film forming method according to the fifth embodiment. The fifth embodiment is applicable to the first or fourth embodiment. In step S801, an exposure apparatus used in a photolithography step (exposure step) performed after formation of a focus compensation film 3 is specified, and the image surface shape of the exposure apparatus is acquired. The acquisition of the image surface shape can be performed for a set angle of view (one shot region) of the exposure apparatus.

In step S802, map information in which the image surface shape (shape information) acquired in step S801 is mapped to a plurality of shot regions of a substrate (process wafer W) for manufacturing an article can be generated. In step S803, the top surface shape of the focus compensation film 3 can be determined based on the information generated in step S802. Here, the top surface shape of the focus compensation film 3 may be determined so as to have the same shape as the shape indicated by the information generated in step S802, or the top surface shape of the focus compensation film 3 may be determined so as to have a shape obtained by correcting the shape indicated by the information generated in step S802. In step S804, based on the top surface shape of the focus compensation film 3 determined in step S803, a drop recipe indicating the arrangement of a composition on a region that covers the plurality of shot regions of the substrate (process wafer W) for manufacturing an article can be generated. In step S805, the focus compensation film 3 can be formed. More specifically, first, a composition can be arranged, using a dispenser 309, on the region that covers the plurality of shot regions of the substrate (process wafer W) for manufacturing an article in accordance with the drop recipe generated in step S804. Then, the focus compensation film 3 can be formed by bringing a superstrate M2 into contact with the composition and curing the composition. Step S805 corresponds to each of the step shown in FIG. 3D and the step shown in FIG. 6B.

Figure 10:
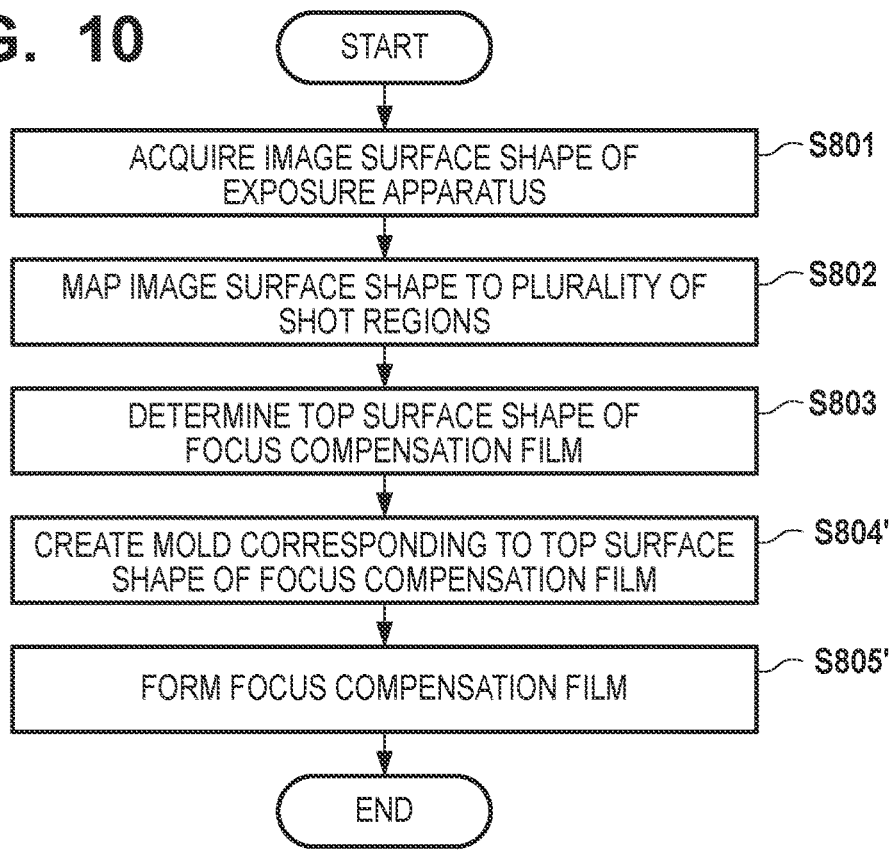
FIG. 10 is a flowchart for explaining an article manufacturing method and a film forming method according to the sixth embodiment.

FIG. 10 is a flowchart for explaining an article manufacturing method and a film forming method according to the sixth embodiment. The sixth embodiment is applicable to the second or third embodiment. Steps S801 to S803 in the flowchart of FIG. 10 are similar to steps S801 to S803 in the flowchart of FIG. 9, respectively. In step S804', a superstrate M2 is created based on the top surface shape of a focus compensation film 3 determined in step S803. In step S805', the focus compensation film 3 is formed using the superstrate M2 created in step S804'. Step S805' corresponds to each of the step shown in FIG. 4E and the step shown in FIG. 5E.

Figure 11A:
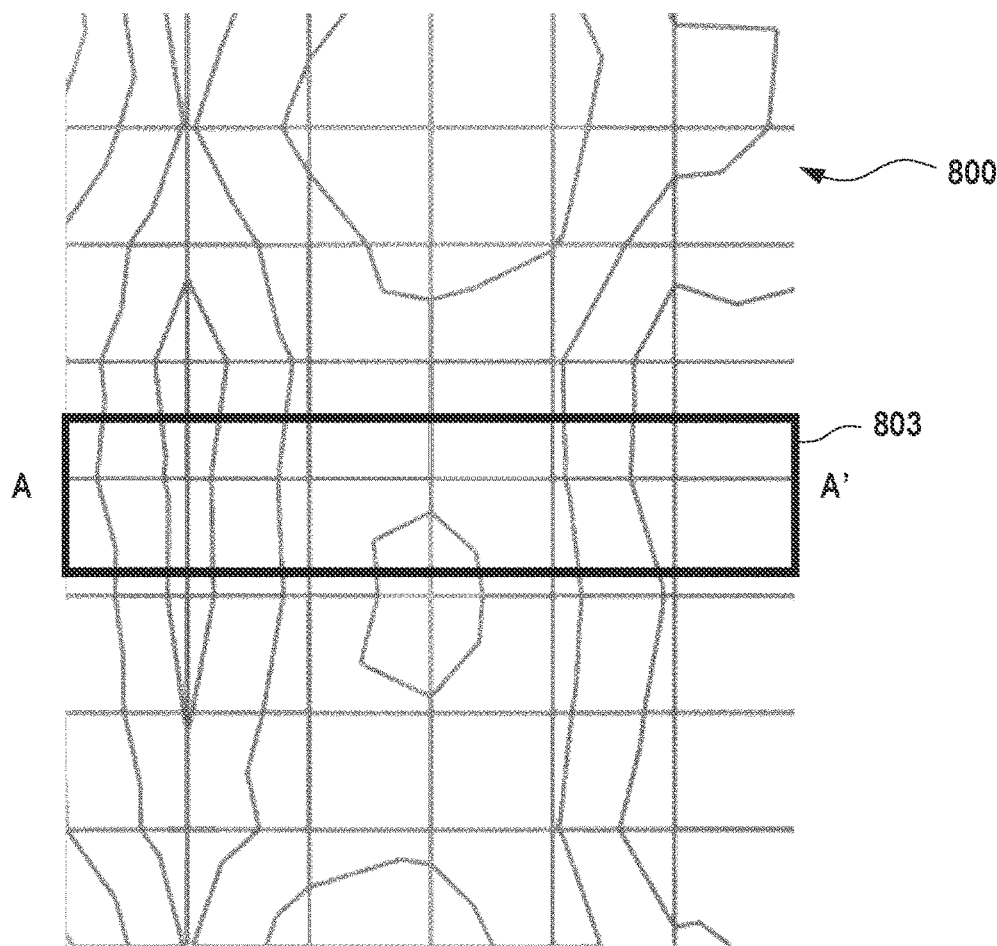
FIGS. 11A to 11C are views for explaining a mold manufacturing method of manufacturing a superstrate (mold) that can be used in the second embodiment.
Figure 11B:
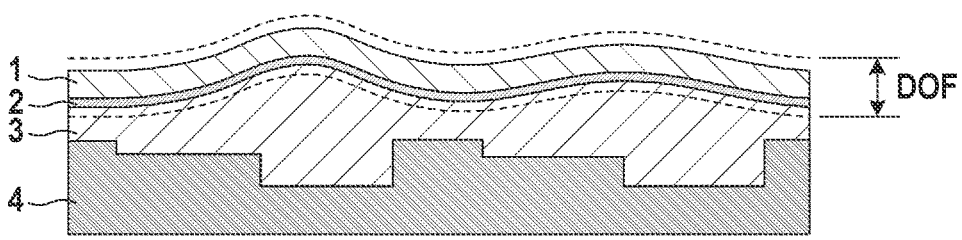

A mold manufacturing method for manufacturing the superstrate M2 (mold) that can be used in the second embodiment will be described with reference to FIG. 11A to 11C. FIG. 11A is a contour diagram showing the image surface shape of the exposure apparatus used in the exposure step. In this example, the exposure apparatus is a scanning exposure apparatus (scanner), and the exposure slit 803 indicates a region irradiated with exposure light at a certain moment. In the scanning exposure apparatus, the image surface shape is a two-dimensional distribution of the difference between the exposed surface (the surface formed by the set of the centers of the photoresist layer 1 in the thickness direction) of the substrate and the best focus surface, which appears in the result of the scanning exposure. FIG. 11B schematically shows the sectional structure of the substrate (here, the structure including the process wafer 4, the focus compensation film 3, the SOG film 2, and the photoresist layer 1) taken along a line A-A' in FIG. 11A.

Figure 11C:
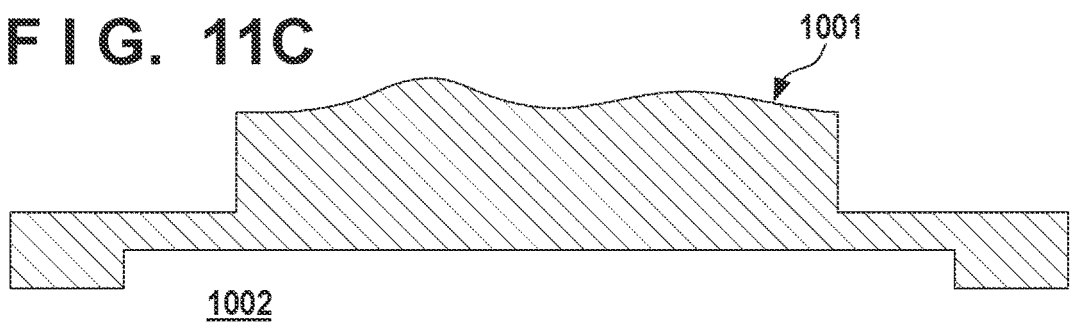

FIG. 11C schematically shows a relief stamp 1002 for manufacturing the superstrate M2. The relief stamp 1002 can have, for example, a relief 1001 of a region for one shot region. The relief 1001 can have a shape according to the shape indicated by contour lines 800. An imprint apparatus and a blank superstrate are prepared, and the relief 1001 can be transferred to a composition (imprint material) arranged on each shot region of the blank superstrate by the imprint apparatus.

Thus, the superstrate M2 that can be used in the film forming apparatus 300 can be manufactured. Here, as has been described above, the film forming apparatus 300 forms, on the process wafer W, the focus compensation film 3 made of a cured product of the composition by bringing the composition on the process wafer W into contact with the molding surface of the superstrate M2 and curing the composition. The molding surface has the top surface shape corresponding to the image surface shape of the exposure apparatus used to form a resist pattern on the focus compensation film 3.

Figure 12:
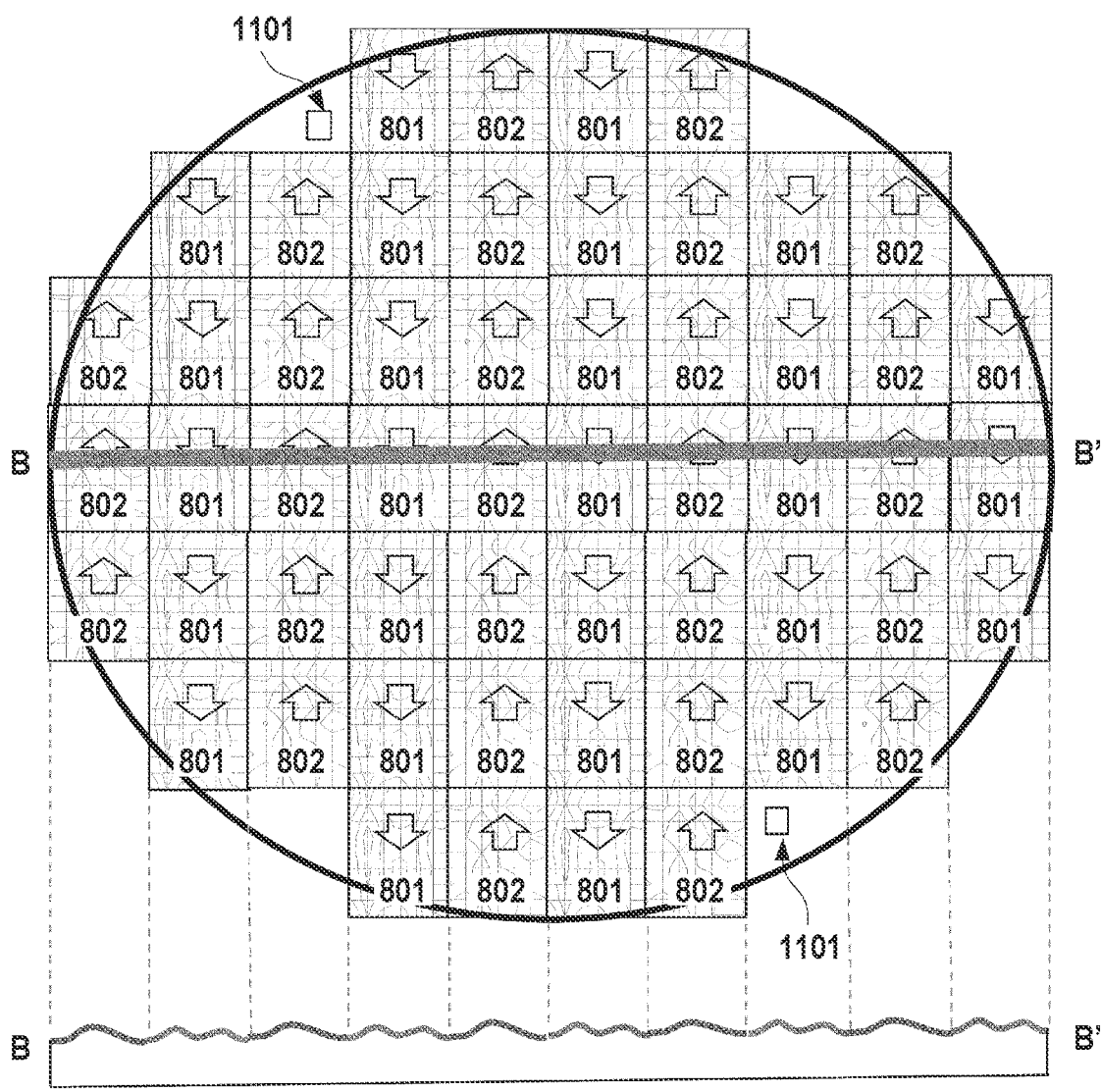
FIG. 12 is a view exemplarily showing the superstrate that can be manufactured using a relief stamp described with reference to FIG. 11C.

FIG. 12 schematically shows a plan view and a cross-sectional view of the superstrate M2 that can be manufactured using the relief stamp 1002 described with reference to FIG. 11C. In the manufacturing of the superstrate M2, the scanning direction of each shot region in the scanning exposure apparatus for performing exposure processing on the substrate with the focus compensation film 3 formed thereon using the superstrate M2 may be considered. In the scanning exposure apparatus, the image surface shape can change depending on the scanning direction. Therefore, the superstrate M2 can be manufactured using the relief stamp 1002 corresponding to a down scan 801 in which the substrate is scanned in a downward direction (first direction) and the relief stamp 1002 corresponding to an up scan 802 in which the substrate is scanned in an upward direction (second direction). That is, the superstrate M2 having a top surface shape according to the scanning direction can be manufactured. The superstrate M2 can have alignment marks 1102. Since the height of the superstrate M2 gradually changes in the X and Y directions, it may be sufficient if the alignment accuracy by the alignment marks has a reproducibility of about 10 μm. The superstrate M2 may be manufactured by a plurality of photolithography steps, for example. The superstrate M2 thus formed may be provided with a protective film to protect its surface. The protective film can be formed by, for example, coating the surface of the superstrate M2 with CYTOP®.

Figure 13:
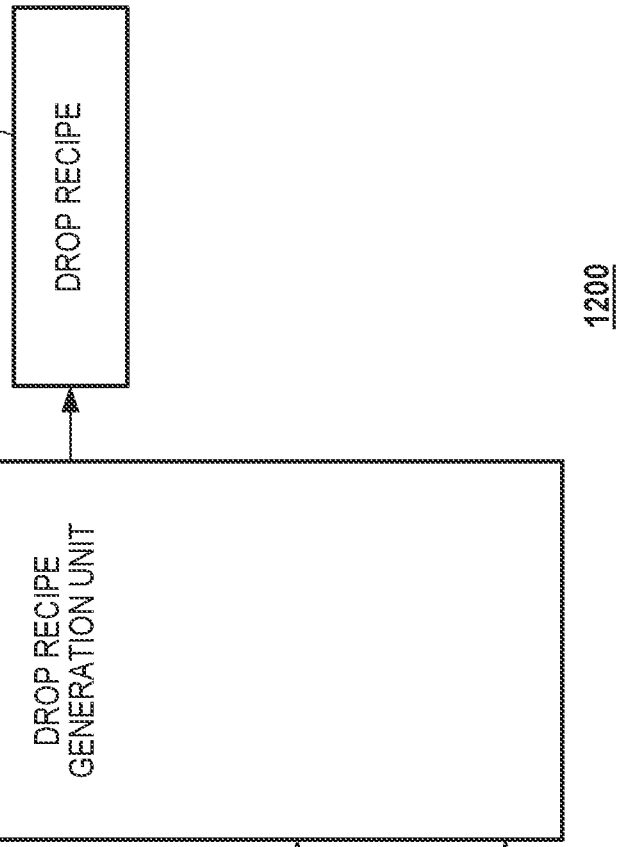
FIG. 13 is a view showing an arrangement example of an information processing apparatus that generates a drop recipe provided to the film forming apparatus.

FIG. 13 shows an arrangement example of an information processing apparatus 1200 that generates a drop recipe 1206 provided to the film forming apparatus 300. The information processing apparatus 1200 can be formed by, for example, a general- or special-purpose computer installed with a program, or a combination of all or some of them. The program or a memory medium storing the program can also be understood as an embodiment of the invention. The information processing apparatus 1200 may be incorporated in the film forming apparatus 300. The dispenser 309 can include a plurality of discharge nozzles for discharging a composition. Here, the plurality of discharge nozzles can be arranged at a predetermined array pitch in the Y direction, for example. The composition can be discharged from the dispenser 309 while the process wafer 4 is scanned in the Y direction by the substrate driving mechanism 308, so that the composition can be arranged on the process wafer 4. The resolution (mesh) of arrangement of the composition can be determined by the array pitch of the discharge nozzles, the scanning speed of the substrate holder 304, and the discharge frequency of the composition from the discharge nozzles. The discharge amount of the composition from one discharge nozzle of the dispenser 309 can be, for example, 1 pL to 3 pL. The density of the composition dropped onto the process wafer W can be determined by the number of discharge command points on the mesh per unit area and the number of scans. The drop recipe can include, for example, a list of discharge command points, a scanning direction, and information regarding the number of scans.

The information processing apparatus 1200 can include a target topograph determination unit 1204 and a drop recipe generation unit 1205. When the information processing apparatus 1200 is applied to the first or fourth embodiment, the composition 3' can be arranged on the process wafer W by the dispenser 309 in accordance with the drop recipe generated by the drop recipe generation unit 1205. When the information processing apparatus 1200 is applied to the second or third embodiment, the superstrate M2 can be manufactured so as to have the top surface shape determined by the target topograph determination unit 1204.

The target topograph determination unit 1204 can determine the top surface shape information of the focus compensation film 3 and the compensation amount distribution information for compensating the surface unevenness of the process wafer W based on shot array information 1201, image surface shape information 1202, and wafer topography information 1203, and provide the drop recipe generation unit 1205 with the top surface shape information and the compensation amount distribution information. The shot array information 1201 can include information indicating the array of the plurality of shot regions on the process wafer W. The image surface shape information 1202 includes, for example, information indicating the image surface shape of the exposure apparatus, and this information can include information for each shot region. The information indicating the image surface shape can include information depending on the scanning direction in the scanning exposure apparatus. The target topograph determination unit 1204 maps the image surface shape of each shot region to the corresponding shot region based on the shot array information 1201. Thus, the topograph determination unit 1204 can generate map information indicating the image surface shape of a region which covers the plurality of shot regions of the process wafer W.

The drop recipe generation unit 1205 can generate a drop recipe based on the top surface shape and the compensation amount distribution provided from the target topograph determination unit 1204, composition information 1207, and dispenser characteristic information 1208. The composition information 1207 can include information indicating the volatilization amount of the composition. The drop recipe generation unit 1205 can use the information for predicting the volatilization amount of the composition to adjust the arrangement of the composition so as to correct a decrease of the composition due to volatilization.

The information processing apparatus 1200 may be configured to process at least one of first information obtained from an exposure apparatus that projects a pattern of an original onto a resist layer on a substrate and exposes the resist layer, and second information obtained from the substrate processed by the exposure apparatus. Based on at least one of the first information and the second information, the information processing apparatus 1200 can perform a step of acquiring shape information indicating the image surface shape of the exposure apparatus, and a step of generating map information in which the shape information is mapped to a plurality of shot regions of a substrate for manufacturing an article. The first information can be, for example, the shot array information and the image surface shape information, or the map information. The second information can be, for example, information obtained by measuring the substrate having undergone the exposure step by the exposure apparatus (for example, information obtained by actually measuring the image surface shape).

Figure 14:
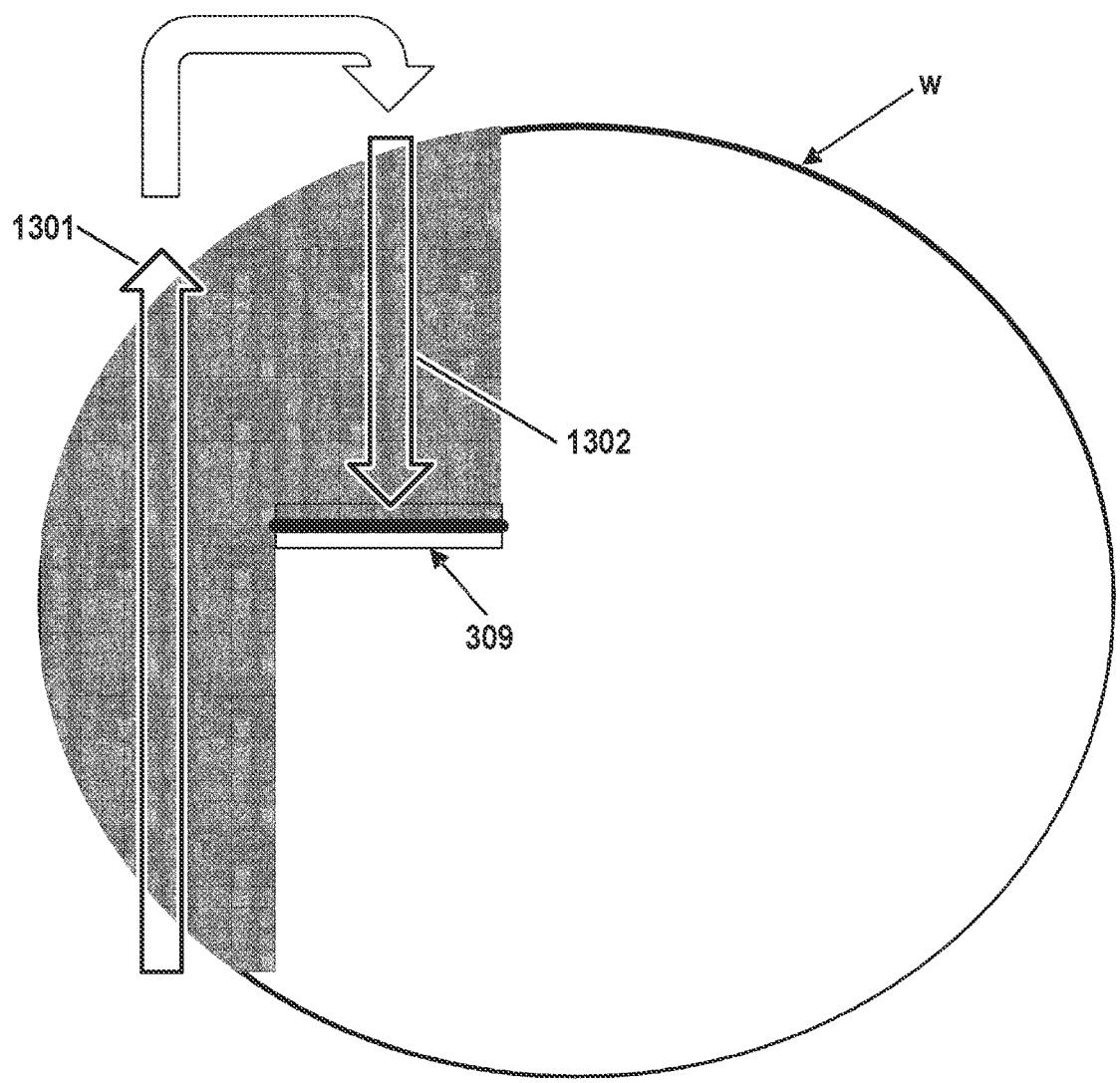
FIG. 14 is a view schematically showing how a composition for forming the focus compensation film is arranged on the process wafer in accordance with the drop recipe generated by the information processing apparatus.
Figure 15A:
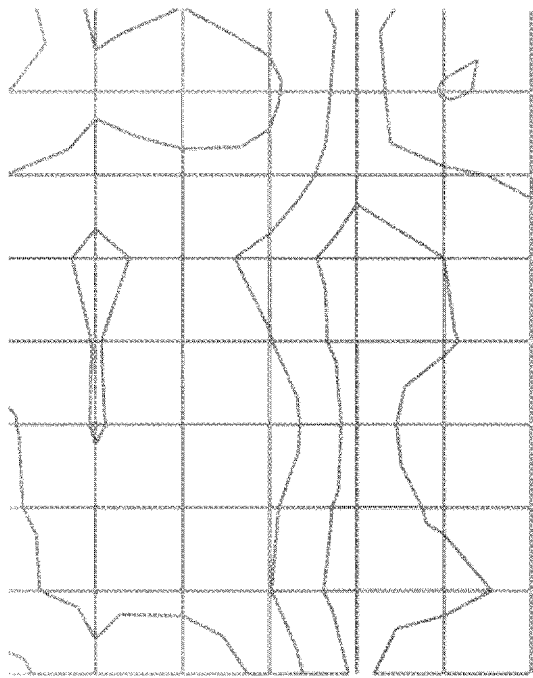
FIGS. 15A to 15D are views each exemplarily showing an image surface shape depending on an illumination mode and a reticle.
Figure 15B:
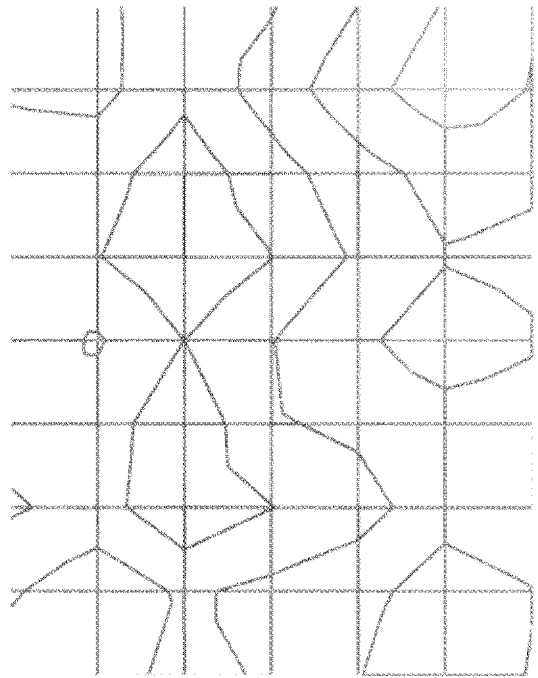
Figure 15C:
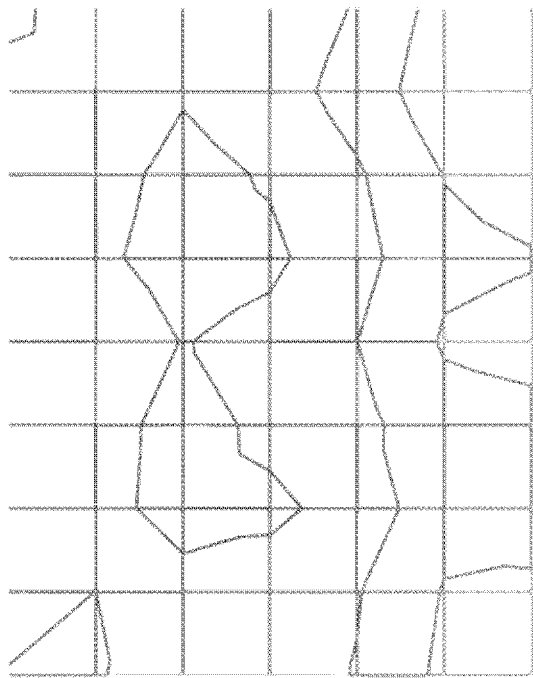
Figure 15D:
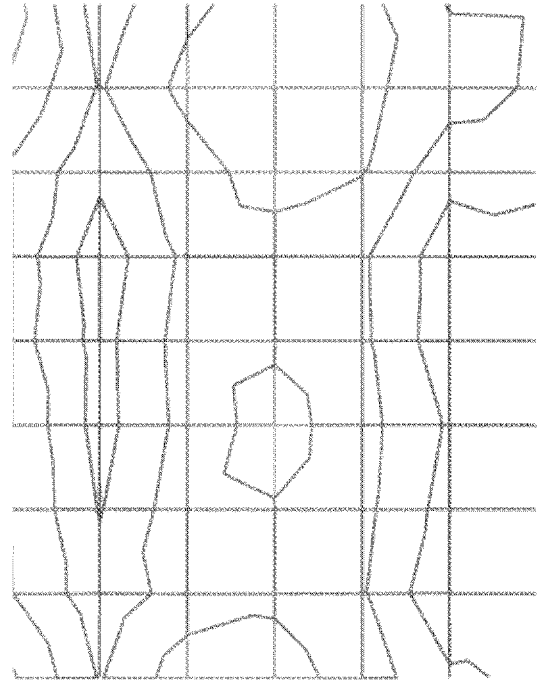

FIG. 14 schematically shows how the composition 3' for forming the focus compensation film 3 is arranged on the process wafer W in accordance with the drop recipe generated by the information processing apparatus 1200. The relative movement of the dispenser 309 with respect to the process wafer W is shown as loci 1301 and 1302. When it takes a long time to arrange the composition on the entire region of the process wafer W and the volatilization of the composition during that time cannot be ignored, a drop recipe in which the supply amount of the composition has been adjusted in consideration of the volatile content can be used.

The image surface shape can depend on the illumination mode as the illumination condition of the reticle of the exposure apparatus, and the reticle in addition to the scanning direction. FIGS. 15A to 15D show four examples of the image surface shape depending on the illumination mode and the reticle. The illumination mode includes, for example, dipole illumination, quadrupole illumination, annular illumination, and the like. The image surface shape can be determined in accordance with a combination of the scanning direction, the illumination mode, the reticle, and the like. Therefore, the top surface shape of the focus compensation film 3 can be determined in consideration of them.

Figure 16:
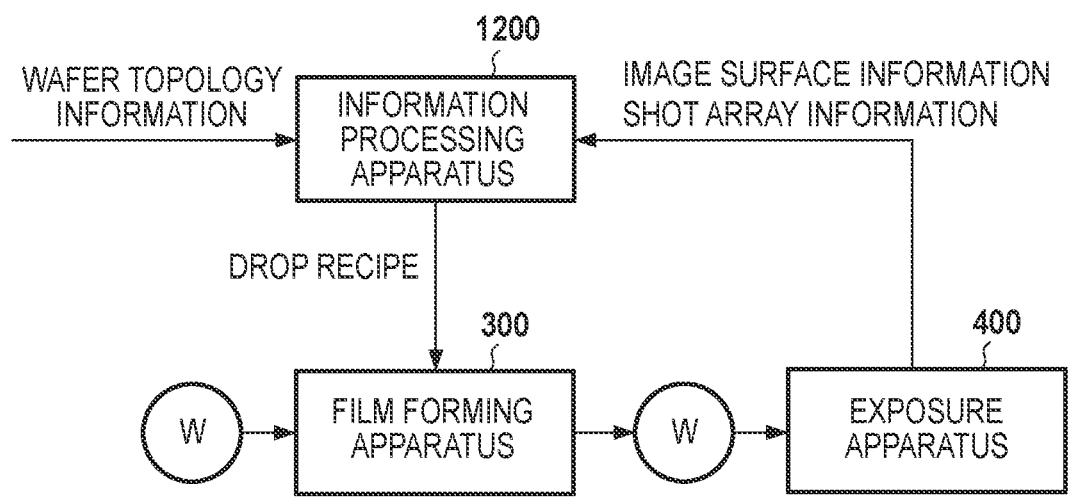
FIG. 16 is a view schematically showing a configuration example of an article manufacturing system according to one embodiment.

FIG. 16 schematically shows a configuration example of an article manufacturing system according to one embodiment. A process wafer W with a focus compensation film 3 formed thereon by a film forming apparatus 300 is provided to an exposure apparatus 400 after an SOG film 2 and a photoresist layer (resist layer) 1 are formed by a processing apparatus (not shown), and the photoresist layer 1 is exposed in the exposure apparatus 400. The exposure apparatus 400 can provide an information processing apparatus 1200 with image surface information and shot array information described above. When the exposure apparatus 400 is a scanning exposure apparatus, the shot array information can include the scanning direction for each shot region.

Here, the result of processing a certain process wafer W using the film forming apparatus 300 and the exposure apparatus 400 may be fed back to the information processing apparatus 1200 as image surface information. In this case, the information processing apparatus 1200 can correct or update the drop recipe based on the fed-back image surface information.

Figure 17:
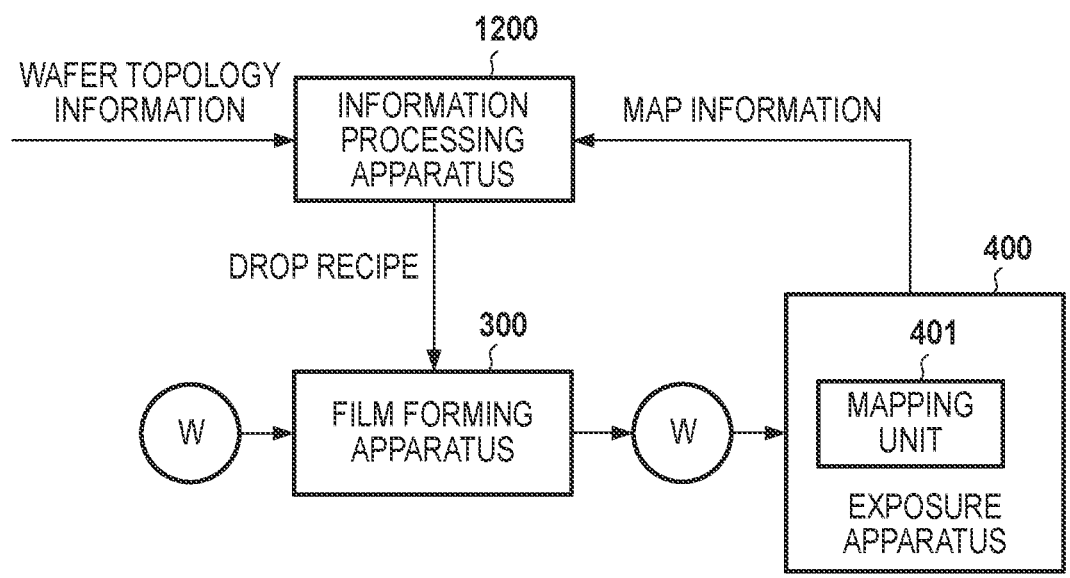
FIG. 17 is a view schematically showing a configuration example of an article manufacturing system according to another embodiment.

FIG. 17 schematically shows a configuration example of an article manufacturing system according to another embodiment. In the example shown in FIG. 17, an exposure apparatus 400 or an information processing apparatus associated therewith can include a mapping unit 401. The mapping unit 401 can generate and output map information in which the image surface shape of each shot region is mapped to the corresponding shot region based on shot array information 1201. The map information can be provided to an information processing apparatus 1200. The mapping unit 401 can be formed by, for example, a processor, and the processor can be formed by a PLD (an abbreviation for Programmable Logic Device) such as an FPGA (an abbreviation for Field Programmable Gate Array), an ASIC (an abbreviation for Application Specific Integrated Circuit), a general- or special-purpose computer installed with a program, or a combination of all or some of these components. A memory medium storing the program can also be understood as an embodiment of the invention.

As has described above, by forming the focus compensation film 3 having the top surface shape corresponding to the image surface shape of the exposure apparatus, forming a photoresist layer on the focus compensation film 3, and providing the process wafer with the focus compensation film and the photoresist layer formed thereon to the exposure apparatus, it is possible to reduce or cancel the defocus that can occur in the exposure apparatus. Here, when the exposure apparatus is a scanning exposure apparatus, the defocus that can occur in the exposure apparatus can be caused by the eigenvalue component of the image surface curvature of the scan image surface.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-141682, filed Jul. 31, 2019, which is hereby incorporated by reference herein in its entirety.

What is claimed is:

1. An article manufacturing method comprising:
acquiring image surface shape information of an image surface shape of an exposure apparatus configured to transfer a pattern of an original to a resist layer;
a first formation step of forming a focus compensation film on a substrate, the focus compensation film having a top surface;
a second formation step of forming the resist layer on the focus compensation film; and
a transfer step of transferring the pattern of the original to the resist layer using the exposure apparatus,
wherein in the first formation step, the focus compensation film is formed based on the acquired image surface shape information such that the top surface of the focus compensation film has a shape that corresponds to the image surface shape of the exposure apparatus.

2. The method according to claim 1, further comprising a measurement step of measuring the image surface shape.

3. The method according to claim 1, wherein the first formation step is performed after a planarizing film is formed on the substrate.

4. The method according to claim 3, wherein the planarizing film is formed by arranging a first composition on the substrate, bringing the first composition into contact with a first mold, and curing the first composition.

5. The method according to claim 3, wherein the planarizing film is an SOC (Spin On Carbon) film.

6. The method according to claim 1, wherein the first formation step includes an arrangement step of arranging a second composition on the substrate, a contact step of bringing the second composition into contact with a second mold, and a curing step of forming the focus compensation film by curing the second composition.

7. The method according to claim 6, wherein in the arrangement step, the second composition is arranged on the substrate in accordance with the image surface shape.

8. The method according to claim 6, wherein a mold having a top surface shape corresponding to the image surface shape is used as the second mold.

9. The method according to claim 8, wherein the top surface shape corresponding to the image surface shape includes a plurality of concave portions each having a depth corresponding to the image surface shape.

10. The method according to claim 6, wherein the substrate includes a plurality of shot regions, and the second mold includes a region that covers the plurality of shot regions.

11. The method according to claim 1, wherein the exposure apparatus is a scanning exposure apparatus, and the image surface shape is a two-dimensional distribution of a difference between an exposed surface of the substrate and a best focus surface, which appears in a result of scanning exposure.

12. The method according to claim 11, wherein the image surface shape depends on a direction of the scanning exposure.

13. A film forming method of forming a focus compensation film having a target top surface shape on a substrate, the method comprising:
acquiring image surface shape information of an image surface shape of an exposure apparatus configured to form a resist pattern on the focus compensation film; and
forming the focus compensation film based on the acquired image surface shape information such that the target top surface shape of the focus compensation film corresponds to the image surface shape of the exposure apparatus.

14. The method according to claim 13, further comprising a measurement step of measuring the image surface shape.

15. The method according to claim 13, wherein the focus compensation film is formed on a planarizing film arranged on the substrate.

16. The method according to claim 15, wherein the planarizing film is formed by arranging a first composition on the substrate, bringing the first composition into contact with a first mold, and curing the first composition.

17. The method according to claim 15, wherein the planarizing film is an SOC (Spin On Carbon) film.

18. The method according to claim 13, wherein the focus compensation film is formed through an arrangement step of arranging a second composition on the substrate, a contact step of bringing the second composition into contact with a second mold, and a curing step of forming the focus compensation film by curing the second composition.

19. The method according to claim 18, wherein in the arrangement step, the second composition is arranged on the substrate in accordance with the image surface shape.

20. The method according to claim 18, wherein a mold having a top surface shape corresponding to the image surface shape is used as the second mold.

21. The method according to claim 20, wherein the top surface shape corresponding to the image surface shape includes a concave portion corresponding to the image surface shape.

22. The method according to claim 18, wherein the substrate includes a plurality of shot regions, and the second mold includes a region that covers the plurality of shot regions.

23. The method according to claim 13, wherein the exposure apparatus is a scanning exposure apparatus, and the image surface shape is an image surface shape in scanning exposure.

24. The method according to claim 23, wherein the image surface shape depends on a direction of the scanning exposure.

25. A mold manufacturing method of manufacturing a mold used in a film forming apparatus that forms, on a substrate, a focus compensation film made of a cured product of a composition by bringing the composition on the substrate into contact with a molding surface of the mold and curing the composition, the method comprising:
acquiring image surface shape information of an image surface shape of an exposure apparatus configured to form a resist pattern on the focus compensation film; and
manufacturing the mold based on the acquired image surface shape information such that the molding surface of the mold is formed such that the molding surface has a shape that corresponds to the image surface shape of the exposure apparatus.

26. An exposure apparatus that projects a pattern of an original onto a resist layer on a substrate and exposes the resist layer, comprising
a processor configured to (i) acquire image surface shape information of an image surface shape of the exposure apparatus and (ii) output information in which shape information indicating the image surface shape of the exposure apparatus is mapped to a plurality of shot regions of a substrate for manufacturing an article.

27. An information processing method of processing at least one of first information obtained from an exposure apparatus that projects a pattern of an original onto a resist layer on a substrate and exposes the resist layer, and second information obtained from the substrate processed by the exposure apparatus, comprising:
a step of acquiring image surface shape information indicating an image surface shape of the exposure apparatus based on at least one of the first information and the second information; and
a step of generating information in which the acquired image surface shape information is mapped to a plurality of shot regions of a substrate for manufacturing an article.

28. A non-transitory computer-readable medium storing a program for causing a computer to execute an information processing method defined in claim 27.

* * * * *